(12) United States Patent
Zuo

(10) Patent No.: US 11,750,211 B2
(45) Date of Patent: Sep. 5, 2023

(54) ENCODING METHOD AND APPARATUS, STORAGE MEDIUM, AND COMPUTER DEVICE

(71) Applicant: BYD COMPANY LIMITED, Shenzhen (CN)

(72) Inventor: Qiang Zuo, Shenzhen (CN)

(73) Assignee: BYD COMPANY LIMITED, Shenzhen (CN)

(*) Notice: Subject to any disclaimer, the term of this patent is extended or adjusted under 35 U.S.C. 154(b) by 16 days.

(21) Appl. No.: 17/611,834

(22) PCT Filed: Jun. 19, 2020

(86) PCT No.: PCT/CN2020/097038
§ 371 (c)(1),
(2) Date: Nov. 16, 2021

(87) PCT Pub. No.: WO2020/259400
PCT Pub. Date: Dec. 30, 2020

(65) Prior Publication Data
US 2022/0224352 A1    Jul. 14, 2022

(30) Foreign Application Priority Data
Jun. 25, 2019 (CN) .......................... 201910553814.0

(51) Int. Cl.
*H03M 7/14* (2006.01)
*H04L 1/00* (2006.01)

(52) U.S. Cl.
CPC ............ *H03M 7/14* (2013.01); *H04L 1/0056* (2013.01)

(58) Field of Classification Search
CPC ......... H03M 7/14; H03M 7/20; H03M 7/3084
See application file for complete search history.

(56) References Cited

U.S. PATENT DOCUMENTS

| | | | | |
|---|---|---|---|---|
| 5,457,794 A | * | 10/1995 | Azumatani | G06F 16/90344 |
| 10,911,064 B1 | * | 2/2021 | Xie | H03M 7/6011 |
| 2002/0057213 A1 | * | 5/2002 | Heath | H03M 7/3088 |
| | | | | 341/51 |
| 2009/0016627 A1 | * | 1/2009 | Uetani | H04N 19/593 |
| | | | | 382/238 |
| 2010/0149003 A1 | * | 6/2010 | Yoshida | H03M 5/145 |
| | | | | 341/59 |
| 2010/0225506 A1 | * | 9/2010 | Chen | H03M 7/48 |
| | | | | 341/51 |

(Continued)

FOREIGN PATENT DOCUMENTS

| | | |
|---|---|---|
| CN | 101103533 A | 1/2008 |
| CN | 101989443 A | 3/2011 |
| CN | 103001649 A | 3/2013 |

(Continued)

OTHER PUBLICATIONS

The World Intellectual Property Organization (WIPO) International Search Report for PCT/CN2020/097038 dated Sep. 2, 2020 6 pages (with translation).

*Primary Examiner* — Lam T Mai
(74) *Attorney, Agent, or Firm* — Wenye Tan

(57) ABSTRACT

An encoding method includes traversing a to-be-encoded string, searching for a preset string in the to-be-encoded string, and deleting the preset string in the to-be-encoded string if the preset string is found, to obtain a target string.

11 Claims, 5 Drawing Sheets

(56) References Cited

U.S. PATENT DOCUMENTS

2016/0253679 A1* 9/2016 Venkatraman ..... G06Q 30/0185
  705/310
2017/0154126 A1* 6/2017 Ballentine ......... G06F 16/90344

FOREIGN PATENT DOCUMENTS

| CN | 106407285 A | 2/2017 |
| CN | 107818121 A | 3/2018 |
| CN | 108470053 A | 8/2018 |
| CN | 109409099 A | 3/2019 |
| CN | 110532235 A | 12/2019 |
| CN | 111262876 A | 6/2020 |
| EP | 2706466 A1 | 3/2014 |
| WO | 2009061814 A2 | 5/2009 |

* cited by examiner

ENCODING METHOD AND APPARATUS, STORAGE MEDIUM, AND COMPUTER DEVICE

CROSS-REFERENCE TO RELATED APPLICATIONS

The present disclosure is a national phase entry under 35 U.S.C. of International Application No. PCT/CN2020/097038, filed on Jun. 19, 2020, which claims priority to Chinese Patent Application No. 201910553814.0 filed by the BYD Co., Ltd. on Jun. 25, 2019, and entitled ENCODING METHOD AND APPARATUS, STORAGE MEDIUM, AND COMPUTER DEVICE, the entire content of all of which is incorporated herein by reference in its entirety.

FIELD

The present disclosure relates to the technical field of communication technologies, and in particular, to an encoding method and apparatus, a storage medium, and a computer device.

BACKGROUND

During data transmission, to avoid occurrence of some specific characters such as a non-displayable character and a terminator to improve reliability of data transmission and ensure quality of data transmission, data is generally encoded and the encoded data is transmitted. Base64 encoding is one of common encoding manners used to transmit 8-bit bytecodes, and is an encoding method for representing binary data based on 64 visible characters.

In the Base64 encoding, a length of a string is increased after encoding, and the length of the string is increased by about 30%, which severely affects an application effect of the encoded data

SUMMARY

The disclosure is intended to resolve one of the technical problems in the related art at least to some extent.

Therefore, an objective of the disclosure is to provide an encoding method and apparatus, a storage medium, and a computer device. Because a preset string in a to-be-encoded string is deleted for encoding, a total length of the string is not increased during encoding, and an application effect of encoded data is not affected, thereby expanding an application scenario of the encoded data and improving an encoding effect.

To achieve the foregoing objective, a first aspect of embodiments of the present disclosure provides an encoding method, including: traversing a to-be-encoded string; searching for a preset string in the to-be-encoded string; and deleting the preset string in the to-be-encoded string if the preset string is found, to obtain a target string.

According to the encoding method provided in the first aspect of the embodiments of the present disclosure, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, the total length of the string is not increased during encoding, and the application effect of encoded data is not affected, thereby expanding the application scenario of the encoded data and improving the encoding effect.

To achieve the foregoing objective, a second aspect of the embodiments of the present disclosure provides an encoding apparatus, including: a traversal module, configured to traverse a to-be-encoded string; a search module, configured to search for a preset string in the to-be-encoded string; and an encoding module, configured to delete the preset string in the to-be-encoded string if the preset string is found, to obtain a target string.

According to the encoding apparatus provided in the second aspect of the embodiments of the present disclosure, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, the total length of the string is not increased during encoding, and the application effect of encoded data is not affected, thereby expanding the application scenario of the encoded data and improving the encoding effect.

To achieve the foregoing objective, a third aspect of the embodiments of the present disclosure provides a computer-readable storage medium, storing a computer program, where the program, when executed by a processor, implements the encoding method provided in the first aspect of the embodiments of the present disclosure.

According to the computer-readable storage medium in the third aspect of the embodiments of the present disclosure, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, the total length of the string is not increased during encoding, and the application effect of encoded data is not affected, thereby expanding the application scenario of the encoded data and improving the encoding effect.

To achieve the foregoing objective, a fourth aspect of the present disclosure further provides a computer device, including a housing, a processor, a memory, a circuit board, and a power supply circuit, where the circuit board is disposed inside a space enclosed by the housing, and the processor and the memory are disposed on the circuit board; the power supply circuit is configured to supply power to various circuits or devices of the computer device; the memory is configured to store executable program code; and by reading the executable program code stored in the memory, the processor runs a program corresponding to the executable program code to implement the following steps: traversing a to-be-encoded string; searching for a preset string in the to-be-encoded string; and deleting the preset string in the to-be-encoded string if the preset string is found, to obtain a target string.

According to the computer device provided in the fourth aspect of the embodiments of the present disclosure, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, the total length of the string is not increased during encoding, and the application effect of encoded data is not affected, thereby expanding the application scenario of the encoded data and improving the encoding effect.

Additional aspects and advantages of the present disclosure will be given in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible in the description of embodiments made with reference to the following accompanying drawings.

DETAILED DESCRIPTION

Figure 1:
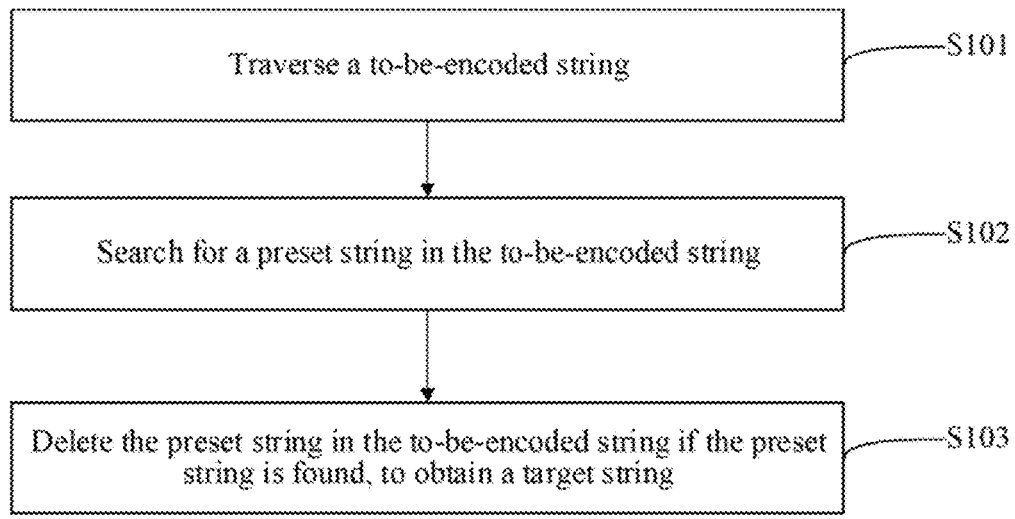
FIG. 1 is a schematic flowchart of an encoding method according to an embodiment of the present disclosure.

Embodiments of the present disclosure are described in detail below, and examples of the embodiments are shown in the accompanying drawings, where the same or similar elements or the elements having same or similar functions are denoted by the same or similar reference numerals throughout the description. The embodiments described below with reference to the accompanying drawings are exemplary and used only for explaining the present disclosure, and should not be construed as a limitation on the present disclosure. On the contrary, the embodiments of the present disclosure include all changes, modifications, and equivalents falling within the spirit and connotation scope of the appended claims.

In the present disclosure, to resolve a technical problem in the related art that in Base64 encoding, a length of a string is increased after encoding, and the length of the string is increased by about 30%, which severely affects an application effect of encoded data, an encoding method is provided. A to-be-encoded string is traversed, a preset string in the to-be-encoded string is searched for, and when the preset string is found, the preset string in the to-be-encoded string is deleted to obtain a target string. Because the preset string in the to-be-encoded string is deleted for encoding, a total length of the string is not increased during encoding, and the application effect of the encoded data is not affected, thereby expanding an application scenario of the encoded data and improving an encoding effect.

FIG. 1 is a schematic flowchart of an encoding method according to an embodiment of the present disclosure.

In this embodiment, a description is made by using an example in which the encoding method is configured in an encoding apparatus.

The encoding method in this embodiment may be configured in the encoding apparatus, the encoding apparatus may be disposed in a server, or may be disposed in an electronic device, which is not limited in the embodiments of the present disclosure.

In this embodiment, an example in which the encoding method is configured in the electronic device is used.

It should be noted that, this embodiment of the present disclosure may be performed, for example, by a central processing unit (CPU) in a server or an electronic device in hardware, or may be performed, for example, by a related backend service in a server or an electronic device in software, which is not limited.

Referring to FIG. 1, the method includes the following steps:

S101: Traverse a to-be-encoded string.

A current string that needs to be encoded may be referred to as the to-be-encoded string.

The to-be-encoded string may be, for example, ddaaedaf.

In a specific execution process, traversal of the to-be-encoded string may start from front to back from a first bit of the to-be-encoded string, or traversal of the to-be-encoded string may start from back to front from a last bit of the to-be-encoded string, which is not limited.

S102: Search for a preset string in the to-be-encoded string.

The preset string may be preset, and may be preset by a factory program of an encoding apparatus, or may be set by a user of an encoding apparatus according to encoding requirements, which is not limited.

A length of the preset string may be at least one bit, which is not limited.

In some embodiments, to ensure that a total length of the string is not increased during encoding and to improve search efficiency during traversal, generally, the length of the preset string may be set to two or one bit, and the preset string may be, for example, da or d.

In a specific execution process, the to-be-encoded string may be traversed from front to back, to search for the preset string in the to-be-encoded string, or the to-be-encoded string may be traversed from back to front, to search for the preset string in the to-be-encoded string, which is not limited.

In this embodiment of the present disclosure, an example in which traversal of the to-be-encoded string starts from front to back from the first bit of the to-be-encoded string, to search for the preset string in the to-be-encoded string is used, and an example in which the to-be-encoded string is ddaaedaf and the preset string is da is used for description.

S103: Delete the preset string in the to-be-encoded string if the preset string is found, to obtain a target string.

For example, the to-be-encoded string is ddaaedaf and the preset string is da, the to-be-encoded string ddaaedaf is traversed from front to back; and da is found at a second bit of ddaaedaf, da is found at a sixth bit of ddaaedaf, and da in ddaaedaf is deleted to obtain a string daef. In this case, the string daef may continue to be traversed, da is found at a first bit of daef, and da in daef is deleted; and when the preset string is not found, a target string ef is obtained.

In a specific execution process, for ease of decoding, the target string is restored to obtain the to-be-encoded string, so that the encoding and decoding method is more suitable. In this embodiment of the present disclosure, after the preset string is found, an index value of the found preset string in the to-be-encoded string may be further obtained, and when the preset string in the to-be-encoded string is deleted to obtain the target string, the index value is inserted into the target string in a preset insertion manner, a length of the preset string being not less than a placeholder length of the index value.

In the specific execution process, to avoid affecting a length of an encoded string, and to ensure encoding efficiency, a placeholder of the index value may be set to one bit. In this case, the length of the preset string is not less than the placeholder length of the index value, that is, it may be ensured that the length of the encoded string is not increased.

The length of the preset string may be set to be greater than the placeholder length of the index value. That is, during the encoding, the preset string is deleted, and the index value of the preset string is added; and the length of the preset string may be set to be greater than the placeholder length of the index value, and a number of bits deleted is more than a number of bits added. Therefore, the length of the encoded string is not increased, which is not limited.

The preset insertion manner may be, for example, inserting the index value at a last bit of the target string, or inserting the index value into a position set in the middle of the target string, or inserting the index value at a first bit of the target string, which is not limited.

For different preset insertion manners, corresponding preset reading manners are configured, the preset reading manners being used for reading corresponding index values when the target string is decoded.

In this embodiment of the present disclosure, before the preset string in the to-be-encoded string is searched for, a count flag bit may be further added to a target position of the to-be-encoded string. The count flag bit is used for recording a number of times the preset string is found in a process of traversing the to-be-encoded string, so that the number of times the preset string is found can be counted and recorded, making it convenient to determine a moment of end of restoration during subsequent decoding, and accurately decode the target string.

The target position may be the last bit of the to-be-encoded string, or may be the first bit of the to-be-encoded string, that is, the count flag bit may be added to the last bit of the to-be-encoded string, or the count flag bit may be added to the first bit of the to-be-encoded string. Initially, the count flag bit is added to the target position of the to-be-encoded string, and a number of times in the count flag bit can be set to zero. Subsequently, each time the preset string is found from the to-be-encoded string, the number of times recorded by the count flag bit can be increased by one.

In this embodiment of the present disclosure, if the count flag bit is added to the target position of the to-be-encoded string, each time the preset string is found from the to-be-encoded string, an index value of the currently found preset string may be inserted into a position adjacent to the target position in the target string, avoiding cumbersome search for the index value from the target string during decoding, and the index value can be readily read when the moment of the end of the restoration is determined, thereby improving encoding and decoding efficiency.

In this embodiment of the present disclosure, the target position may be set to the last bit of the to-be-encoded string, and the inserting into the position adjacent to the target position in the target string includes: inserting into a previous position adjacent to the last bit in the target string. When the to-be-encoded string is traversed from front to back, it can be convenient to traverse the to-be-encoded string from the first bit without interfering with the process, conforming to encoding logic of a machine to read characters. In addition, when a plurality of preset strings are included in the to-be-encoded string, corresponding index values are stored in the form of a stack, which is convenient for subsequent accurate decoding and restoration.

In terms of the technical features described above, the embodiments of the present disclosure further provide a specific implementation method for encoding. Specifically, if the preset string is found, the preset string in the to-be-encoded string is deleted, and a to-be-encoded string remaining after deletion is used as an intermediate string; the index value is inserted into the intermediate string in the preset insertion manner, and the number of times in the count flag bit is increased by one; and when the preset string is not found, a current intermediate string is used as the target string.

Figure 2:
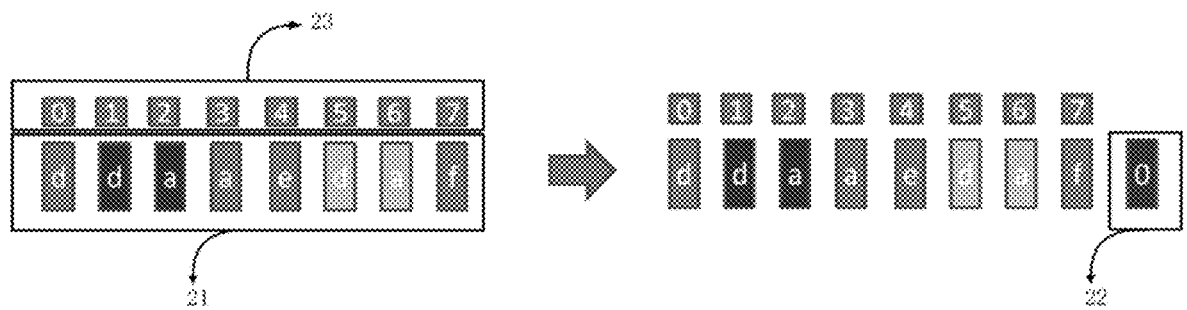
FIG. 2 is a schematic application diagram according to an embodiment of the present disclosure.

Descriptions are provided below by using an example:

FIG. 2 is a schematic application diagram according to an embodiment of the present disclosure, including a to-be-encoded string 21 and a count flag bit 22. In addition, for ease of clear explanation, a placeholder 23 corresponding to characters in the to-be-encoded string 21 is further shown in FIG. 2. In an initial stage of traversing the to-be-encoded string, a value zero may be assigned to the count flag bit 22, that is, in the initial stage, a count value is zero, which is convenient for counting statistics.

Figure 3:
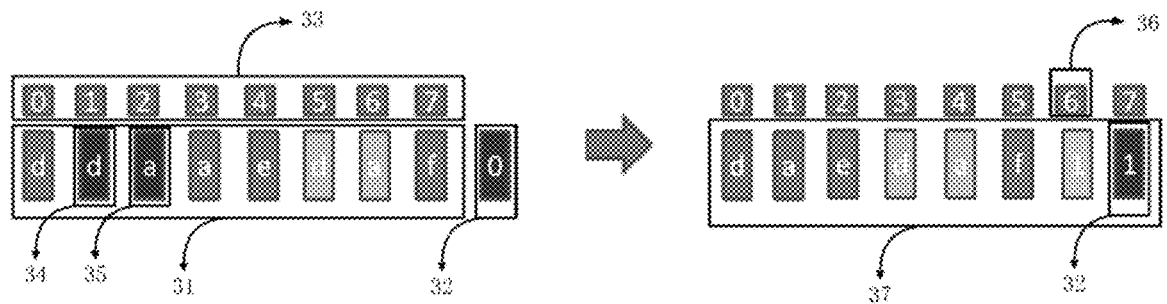
FIG. 3 is another schematic application diagram according to an embodiment of the present disclosure.

FIG. 3 is another schematic application diagram according to an embodiment of the present disclosure, including a to-be-encoded string 31 and a count flag bit 32. In addition, for ease of clear explanation, a placeholder 33 corresponding to characters in the to-be-encoded string 31 is further shown in FIG. 3.

In the example shown in FIG. 3, assuming that a to-be-encoded string ddaaedaf is traversed from front to back, and a start character d of a preset string da is retrieved in the first bit in placeholders indicated by the placeholder 33 (the start character d may be marked as 34), a placeholder 1 corresponding to the start character d is used as an index value of the preset string in the to-be-encoded string, or a placeholder 2 corresponding to an end character a (the end character a may be marked as 35, and 34 and 35 jointly form a first preset string da that is found) of the preset string da may be used as an index value of the preset string in the to-be-encoded string, which is not limited.

Referring to FIG. 3, because the placeholder 1 corresponding to the start character d is used as the index value of the preset string in the to-be-encoded string in FIG. 3, the index value 1 may be inserted into a previous position 36 adjacent to the count flag bit. In addition, the preset string in the to-be-encoded string is deleted to obtain an intermediate string 37. It should be noted that the foregoing only shows encoding processing logic for finding one preset string, and therefore, a string formed by processing may be referred to as an intermediate string.

In the specific execution process of this embodiment, all preset strings included in the to-be-encoded string are traversed, corresponding encoding processing is performed, and a finally obtained string may be referred to as a target string.

Figure 4:
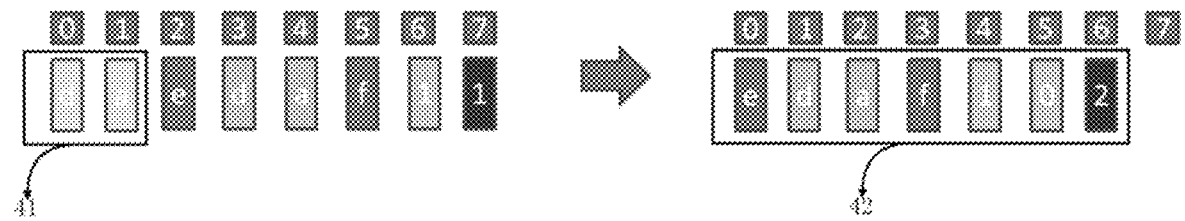
FIG. 4 is another schematic application diagram according to an embodiment of the present disclosure.

Referring to FIG. 3 and FIG. 4, FIG. 4 is another schematic application diagram according to an embodiment of the present disclosure. In FIG. 3, only the encoding processing for finding one preset string is shown. After the intermediate string 37 is obtained in FIG. 3, because the first preset string da is deleted, the remaining characters are combined to form a new preset string da. Therefore, each time the to-be-encoded string is traversed, search is performed from the first bit of the to-be-encoded string.

FIG. 4 shows a new preset string da (the new preset string da is marked as 41) and an intermediate string 42 obtained after corresponding encoding processing. It can be learned that because two preset strings da are deleted after processing is performed twice, and only an index value occupying two bits is added, a length of the string is reduced after encoding.

Figure 5:
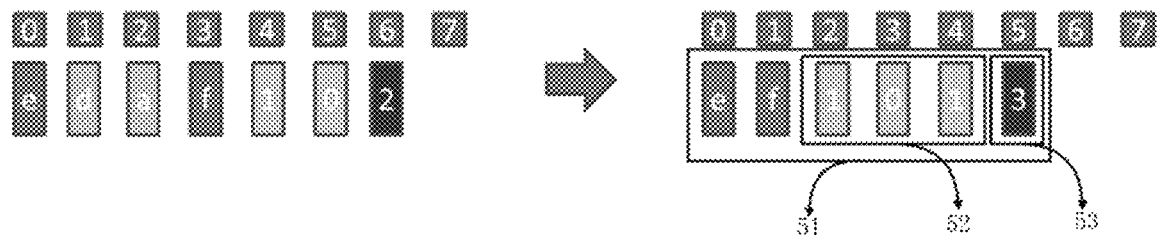
FIG. 5 is another schematic application diagram according to an embodiment of the present disclosure.

Subsequently, the search may be performed again from a first bit of the intermediate string 42. FIG. 5 is another schematic application diagram according to an embodiment of the present disclosure. FIG. 5 shows a target string 51 finally obtained through encoding. The target string 51 includes three index values 52 and a count flag bit 53. Corresponding to a number of the index values, there are three count values in the count flag bit 53.

Figure 6:
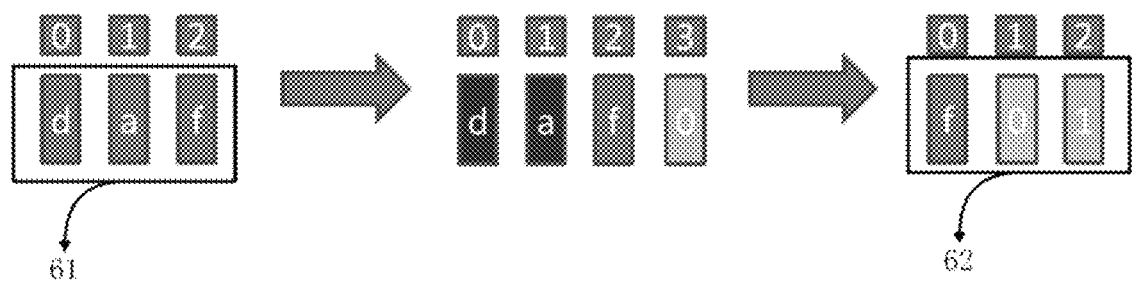
FIG. 6 is another schematic application diagram according to an embodiment of the present disclosure.
Figure 6:
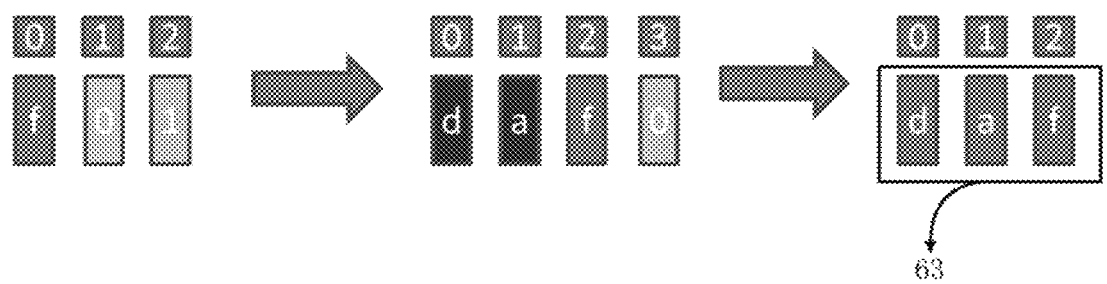

FIG. 6 is another schematic application diagram according to an embodiment of the present disclosure. An example in which a to-be-encoded string is daf and a preset string is da is used in FIG. 6. In addition, FIG. 6 shows an encoding process and a decoding process. A to-be-encoded string 61, a target string 62, and a to-be-encoded string 63 that is obtained through restoration are included in FIG. 6. A found preset string in FIG. 6 is da, and is located at a start position of the to-be-encoded string. The example demonstrates a marginal application scenario, that is, an application scenario in which a preset string to be deleted is at a start position of to-be-encoded data.

In this embodiment, a to-be-encoded string is traversed, a preset string in the to-be-encoded string is searched for, and when the preset string is found, the preset string in the to-be-encoded string is deleted to obtain a target string. Because the preset string in the to-be-encoded string is deleted for encoding, a total length of the string is not increased during encoding, and an application effect of encoded data is not affected, thereby expanding an application scenario of the encoded data and improving an encoding effect.

Figure 7:
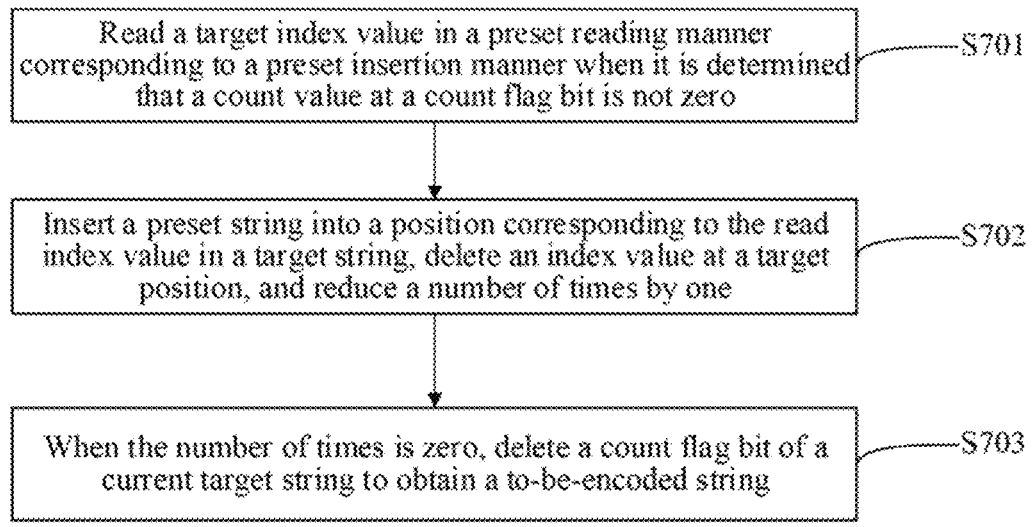
FIG. 7 is a schematic flowchart of an encoding method according to another embodiment of the present disclosure.

FIG. 7 is a schematic flowchart of an encoding method according to another embodiment of the present disclosure.

This embodiment shows a schematic diagram of decoding the target string obtained by the foregoing encoding.

Referring to FIG. 7, the method includes the following steps:

S701: Read a target index value in a preset reading manner corresponding to a preset insertion manner when it is determined that a count value at a count flag bit is not zero.

In this embodiment of the present disclosure, in a process of decoding the target string, a process reverse to the foregoing encoding method is adopted for decoding.

The preset insertion manner may be, for example, inserting the index value at a last bit of the target string, or inserting the index value into a position set in the middle of the target string, or inserting the index value at a first bit of the target string, which is not limited.

For different preset insertion manners, corresponding preset reading manners are configured, the preset reading manners being used for reading corresponding index values when the target string is decoded.

For example, if the preset insertion manner is to insert the index value at the last bit of the target string, the preset reading manner is to read the index value at the last bit of the target string. If the preset insertion manner is to insert the index value into the position set in the middle of the target string, the preset reading manner is to read the index value at the position set in the middle of the target string. If the preset insertion manner is to insert the index value at the first bit of the target string, the preset reading manner is to read the index value at the first bit of the target string, which is not limited.

The example in this embodiment of the present disclosure is that if an index value is inserted at the last bit of the target string, the index value is read at the last bit of the target string in the preset reading manner corresponding to the preset insertion manner. Specifically, the index value is read at a bit previous to the count flag bit, which is not limited.

In a specific execution process, when the index values are stored, the corresponding index values are stored in the form of a stack, that is, an index value stored at a target position is an index value read by the last search. In this case, during reading, because the index value at the target position is read, the first stored index value is read at the end, and the last stored index value is read first, thereby ensuring accuracy of decoding and restoration and avoiding restoration errors.

In this embodiment of the present disclosure, a moment of end of decoding is further determined with reference to a number of times in the count flag bit, that is, when it is determined that the number of times in the count flag bit is not zero, it indicates that the to-be-encoded string has not been decoded completely. In this case, the index value at the target position is continuously read for decoding.

S702: Insert a preset string into a position corresponding to the read index value in the target string, delete the index value at the target position, and reduce the number of times by one.

S703: When the number of times is zero, delete a count flag bit of a current target string to obtain the to-be-encoded string.

Figure 8:
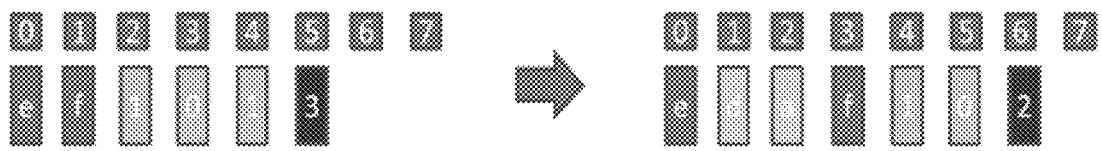
FIG. 8 is another schematic application diagram according to an embodiment of the present disclosure.
Figure 9:
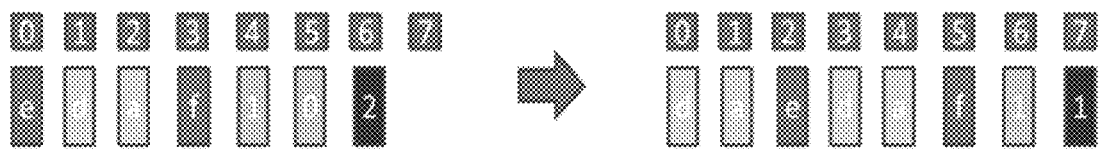
FIG. 9 is another schematic application diagram according to an embodiment of the present disclosure.
Figure 10:
FIG. 10 is another schematic application diagram according to an embodiment of the present disclosure.
Figure 11:
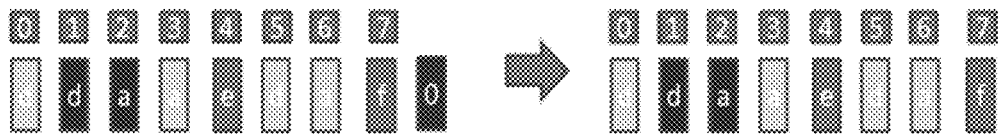
FIG. 11 is another schematic application diagram according to an embodiment of the present disclosure.

Referring to FIG. 8, FIG. 9, FIG. 10, and FIG. 11. FIG. 8 is another schematic application diagram according to an embodiment of the present disclosure. FIG. 9 is another schematic application diagram according to an embodiment of the present disclosure. FIG. 10 is another schematic application diagram according to an embodiment of the present disclosure. FIG. 11 is another schematic application diagram according to an embodiment of the present disclosure. FIG. 8 shows a schematic diagram of an intermediate string obtained by inserting a last preset string that is originally found. FIG. 9 shows a schematic diagram of an intermediate string obtained by inserting a penultimate preset string that is originally found. FIG. 10 shows a schematic diagram of an intermediate string obtained by inserting an antepenultimate (that is, the first) preset string that is originally found. FIG. 11 shows a schematic diagram of a to-be-encoded string obtained through decoding, and compared with the intermediate string in FIG. 10, the count flag bit is deleted from the to-be-encoded string obtained by restoration in FIG. 11.

In this embodiment, a target index value is read in a preset reading manner corresponding to a preset insertion manner when it is determined that a number of times recorded by the count flag bit is not zero; a preset string is inserted into a position corresponding to the target index value in a target string, the target index value is deleted, and the number of times is reduced by one; and when the number of times is zero, a count flag bit of a current target string is deleted to obtain a to-be-encoded string, thereby effectively ensuring accuracy of decoding and restoration and avoiding restoration errors.

Figure 12:
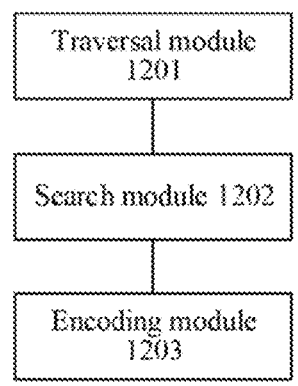
FIG. 12 is a schematic structural diagram of an encoding apparatus according to an embodiment of the present disclosure.

FIG. 12 is a schematic structural diagram of an encoding apparatus according to an embodiment of the present disclosure.

Referring to FIG. 12, the apparatus 120 includes:

a traversal module 1201, configured to traverse a to-be-encoded string;

a search module 1202, configured to search for a preset string in the to-be-encoded string; and an encoding module 1203, configured to delete the preset string in the to-be-encoded string if the preset string is found, to obtain a target string.

In some embodiments, the encoding module 1203 is further configured to:

obtain an index value of the found preset string in the to-be-encoded string; and insert the index value into the target string in a preset insertion manner, a length of the preset string being not less than a placeholder length of the index value.

Figure 13:
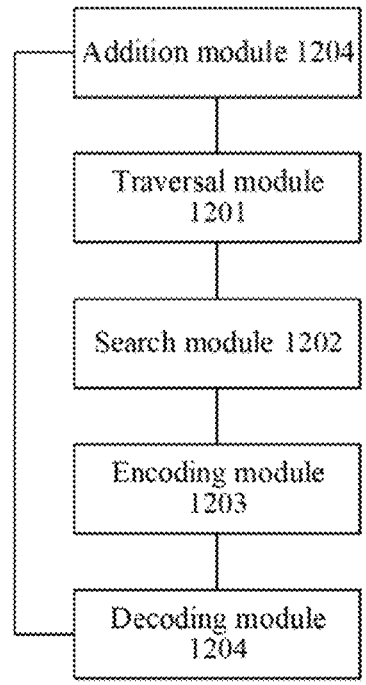
FIG. 13 is a schematic structural diagram of an encoding apparatus according to another embodiment of the present disclosure.

In some embodiments, referring to FIG. 13, the encoding apparatus further includes:

an addition module 1204, configured to add a count flag bit to a target position of the to-be-encoded string, the count flag bit being used for recording a number of times the preset string is found in a process of traversing the to-be-encoded string.

In some embodiments, the encoding module 1203 is further configured to:

each time the preset string is found from the to-be-encoded string, insert an index value of the currently found preset string into a position adjacent to the target position in the target string.

In some embodiments, the target position is a last bit of the to-be-encoded string, and the encoding module 1203 is further configured to:

insert into a previous position adjacent to the last bit in the target string.

In some embodiments, the encoding module 1203 is further configured to:

delete the preset string in the to-be-encoded string if the preset string is found, a to-be-encoded string remaining after deletion being used as an intermediate string;

insert the index value into the intermediate string in the preset insertion manner, and increase the number of times in the count flag bit by one; and when the preset string is not found, use a current intermediate string as the target string.

In some embodiments, referring to FIG. 13, the encoding apparatus further includes:

a decoding module 1204, configured to read a target index value in a preset reading manner corresponding to the preset insertion manner when it is determined that the number of times recorded by the count flag bit is not zero; insert the preset string into a position corresponding to the target index value in the target string, delete the target index value, and reduce the number of times by one; and when the number of times is zero, delete a count flag bit of a current target string to obtain the to-be-encoded string.

It should be noted that, the description of the encoding method embodiments in the foregoing embodiments with reference to FIG. 1 to FIG. 11 is also applicable to the encoding apparatus 120 of this embodiment, which is implemented in a similar principle, and details are not described herein again.

The to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, a total length of the string is not increased during encoding, and an application effect of encoded data is not affected, thereby expanding an application scenario of the encoded data and improving an encoding effect.

To implement the foregoing embodiments, the present disclosure further provides a computer-readable storage medium. When instructions in the storage medium are executed by a processor of the encoding apparatus, the encoding apparatus is enabled to perform an encoding method, and the method includes:

traversing a to-be-encoded string;

searching for a preset string in the to-be-encoded string; and deleting the preset string in the to-be-encoded string if the preset string is found, to obtain a target string.

According to the computer-readable storage medium in this embodiment, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, a total length of the string is not increased during encoding, and an application effect of encoded data is not affected, thereby expanding an application scenario of the encoded data and improving an encoding effect.

Figure 14:
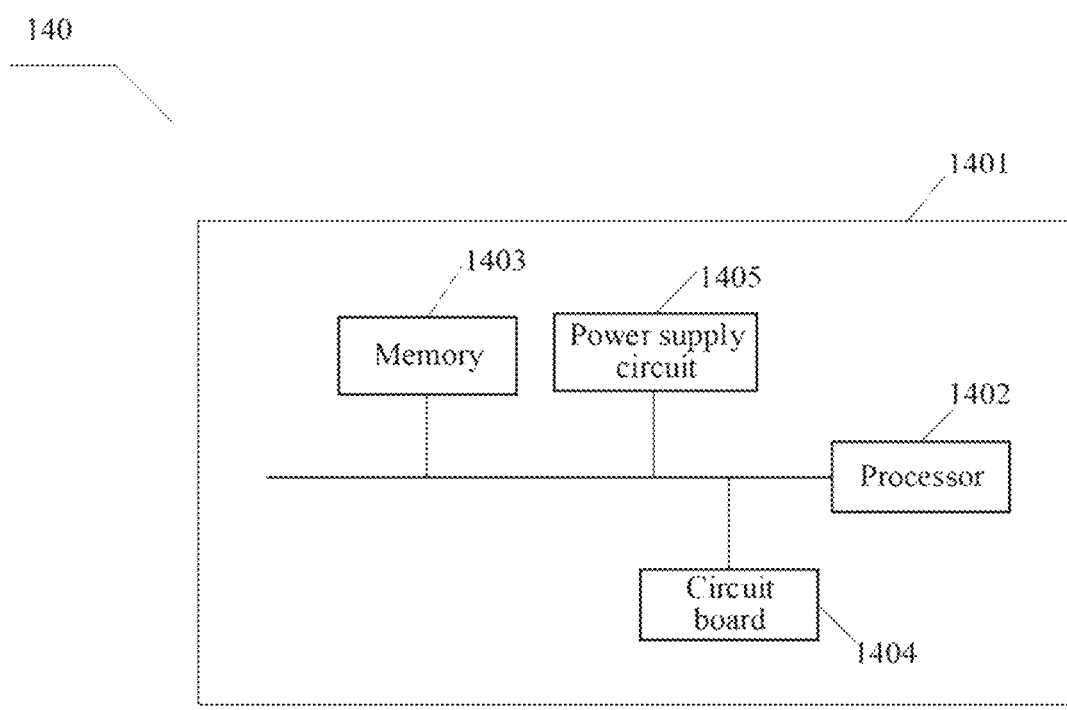
FIG. 14 is a schematic structural diagram of a computer device according to an embodiment of the present disclosure.

FIG. 14 is a schematic structural diagram of a computer device according to an embodiment of the present disclosure.

The computer device 140 may be a mobile phone, a tablet computer, or the like.

Referring to FIG. 14, the computer device 140 in this embodiment includes: a housing 1401, a processor 1402, a memory 1403, a circuit board 1404, and a power supply circuit 1405, where the circuit board 1404 is disposed inside a space enclosed by the housing 1401, and the processor 1402 and the memory 1403 are disposed on the circuit board 1404; the power supply circuit 1405 is configured to supply power to various circuits or devices of the computer device 140; the memory 1403 is configured to store executable program code; and by reading the executable program code stored in the memory 1403, the processor 1402 runs a program corresponding to the executable program code to implement the following steps:

traversing a to-be-encoded string;

searching for a preset string in the to-be-encoded string; and deleting the preset string in the to-be-encoded string if the preset string is found, to obtain a target string.

In some embodiments, the processor is further configured to:

obtain an index value of the found preset string in the to-be-encoded string after the preset string is found; and during the deleting the preset string in the to-be-encoded string, to obtain a target string, the method further includes:

inserting the index value into the target string in a preset insertion manner, a length of the preset string being not less than a placeholder length of the index value.

In some embodiments, the processor is further configured to:

add a count flag bit to a target position of the to-be-encoded string, the count flag bit being used for recording a number of times the preset string is found in a process of traversing the to-be-encoded string.

In some embodiments, the processor is further configured to:

each time the preset string is found from the to-be-encoded string, insert an index value of the currently found preset string into a position adjacent to the target position in the target string.

In some embodiments, the target position is a last bit of the to-be-encoded string, and the processor is further configured to:

insert into a previous position adjacent to the last bit in the target string.

In some embodiments, the processor is further configured to:

delete the preset string in the to-be-encoded string if the preset string is found, a to-be-encoded string remaining after deletion being used as an intermediate string;

insert the index value into the intermediate string in the preset insertion manner, and increase the number of times in the count flag bit by one; and when the preset string is not found, use a current intermediate string as the target string.

In some embodiments, the processor is further configured to decode the target string to be restored to the to-be-encoded string through the following steps, including:

reading a target index value in a preset reading manner corresponding to the preset insertion manner when it is determined that the number of times recorded by the count flag bit is not zero;

inserting the preset string into a position corresponding to the target index value in the target string, deleting the target index value, and reducing the number of times by one; and when the number of times is zero, deleting a count flag bit of a current target string to obtain the to-be-encoded string.

It should be noted that, the description of the encoding method embodiments in the foregoing embodiments with reference to FIG. 1 to FIG. 11 is also applicable to the computer device 140 of this embodiment, which is implemented in a similar principle, and details are not described herein again.

According to the computer device in this embodiment, the to-be-encoded string is traversed, the preset string in the to-be-encoded string is searched for, and when the preset string is found, the preset string in the to-be-encoded string is deleted to obtain the target string. Because the preset string in the to-be-encoded string is deleted for encoding, a total length of the string is not increased during encoding, and an application effect of encoded data is not affected, thereby expanding an application scenario of the encoded data and improving an encoding effect.

It should be noted that, in the descriptions of the present disclosure, terms "first" and "second" are only used to describe the objective and cannot be understood as indicating or implying relative importance. In addition, in the description of the present disclosure, unless otherwise stated, "a plurality of" means two or more than two.

Any process or method in the flowcharts or described herein in another manner may be understood as indicating a module, a segment, or a part including code of one or more executable instructions for implementing a particular logical function or process step. In addition, the scope of exemplary embodiments of the present disclosure includes other implementations which do not follow the order shown or discussed, including performing, according to involved functions, the functions basically simultaneously or in a reverse order, which should be understood by technical personnel in the technical field to which the embodiments of the present disclosure belong.

It should be understood that each part of the present disclosure can be implemented by hardware, software, firmware or a combination thereof. In the foregoing implementations, a plurality of steps or methods may be implemented by using software or firmware that are stored in a memory and are executed by a proper instruction execution system. For example, if being implemented by hardware, like another implementation, the plurality of steps or methods may be implemented by any one of following common technologies in the art or a combination thereof: a discrete logic circuit of a logic gate circuit for realizing a logic function for a data signal, an application-specific integrated circuit having a suitable combined logic gate circuit, a programmable gate array (PGA), and a field programmable gate array (FPGA).

A person of ordinary skill in the art may understand that all or some of the steps of the methods in the foregoing embodiments may be implemented by a program instructing relevant hardware. The program may be stored in a computer-readable storage medium. When the program is executed, one or a combination of the steps of the method embodiments are performed.

In addition, each functional unit in each embodiment of the present disclosure may be integrated into one processing module, or may exist alone physically, or two or more units may be integrated into one module. The integrated module may be implemented in the form of hardware, or may be implemented in the form of a software functional module. If implemented in the form of software functional modules and sold or used as an independent product, the integrated module may also be stored in a computer-readable storage medium.

The storage medium mentioned above may be a read-only memory, a magnetic disk, an optical disc, or the like.

In the descriptions of this specification, descriptions of a reference term such as "an embodiment", "some embodiments", "an example", "a specific example", or "some examples" means that a feature, structure, material, or characteristic that is described with reference to the embodiment or the example is included in at least one embodiment or example of the present disclosure. In this specification, schematic descriptions of the foregoing terms do not necessarily point at a same embodiment or example. In addition, the described specific features, structures, materials, or characteristics may be combined in a proper manner in any one or more of the embodiments or examples.

Although the embodiments of the present disclosure are shown and described above, it may be understood that the foregoing embodiments are exemplary, and cannot be understood as a limitation to the present disclosure. A person of ordinary skill in the art may make changes, modifications, replacements, and variations to the foregoing embodiments without departing from the scope of the disclosure.

What is claimed is:

1. An encoding method, comprising:
   traversing a to-be-encoded string;
   searching for a preset string in the to-be-encoded string; and
   deleting the preset string in the to-be-encoded string if the preset string is found, to obtain a target string,
   wherein after the preset string is found, the method further comprises:
   obtaining an index value of the found preset string in the to-be-encoded string; and
   during the deleting the preset string in the to-be-encoded string, to obtain a target string, the method further comprises:

inserting the index value into the target string in a preset insertion manner, a length of the preset string being not less than a placeholder length of the index value.

2. The encoding method according to claim 1, wherein before the searching for a preset string in the to-be-encoded string, the method further comprising:

adding a count flag bit to a target position of the to-be-encoded string, the count flag bit being used for recording a number of times the preset string is found in the process of traversing the to-be-encoded string.

3. The encoding method according to claim 2, wherein the inserting the index value into the target string in a preset insertion manner comprising:

each time the preset string is found from the to-be-encoded string, inserting an index value of the currently found preset string into a position adjacent to the target position in the target string.

4. The encoding method according to claim 3, the target position is a last bit of the to-be-encoded string, and wherein the inserting into a position adjacent to the target position in the target string comprising:

inserting into a previous position adjacent to the last bit in the target string.

5. The encoding method according to claim 2, wherein the deleting the preset string in the to-be-encoded string if the preset string is found, to obtain a target string comprising:

deleting the preset string in the to-be-encoded string if the preset string is found, a to-be-encoded string remaining after deletion being used as an intermediate string;

inserting the index value into the intermediate string in the preset insertion manner, and increasing the number of times in the count flag bit by one; and when the preset string is not found, using a current intermediate string as the target string.

6. The encoding method according to claim 2, wherein the to-be-encoded string is obtained by:

reading a target index value in a preset reading manner corresponding to the preset insertion manner when it is determined that the number of times recorded by the count flag bit is not zero;

inserting the preset string into a position corresponding to the target index value in the target string, deleting the target index value, and reducing the number of times by one; and when the number of times is zero, deleting a count flag bit of a current target string to obtain the to-be-encoded string.

7. A non-transitory computer-readable storage medium, storing a computer program, wherein the program, when executed by a processor, implements the encoding method according to claim 1.

8. A computer device, comprising a housing, a processor, a memory, a circuit board, and a power supply circuit, wherein the circuit board is disposed inside a space enclosed by the housing, and the processor and the memory are disposed on the circuit board; the power supply circuit is configured to supply power to various circuits or devices of the computer device; the memory is configured to store executable program code; and by reading the executable program code stored in the memory, the processor runs a program corresponding to the executable program code to implement:

traversing a to-be-encoded string;

searching for a preset string in the to-be-encoded string; and deleting the preset string in the to-be-encoded string if the preset string is found, to obtain a target string, wherein the processor is further configured to:

obtain an index value of the found preset string in the to-be-encoded string after the preset string is found; and during the deleting the preset string in the to-be-encoded string, to obtain a target string, the processor is further configured to:

insert the index value into the target string in a preset insertion manner, a length of the preset string being not less than a placeholder length of the index value.

9. The computer device according to claim 8, wherein the processor is further configured to:

add a count flag bit to a target position of the to-be-encoded string, the count flag bit being used for recording a number of times the preset string is found in the process of traversing the to-be-encoded string.

10. The computer device according to claim 9, wherein the processor is further configured to:

each time the preset string is found from the to-be-encoded string, insert an index value of the currently found preset string into a position adjacent to the target position in the target string.

11. The computer device according to claim 10, wherein the target position is a last bit of the to-be-encoded string, and the processor is further configured to:

insert into a previous position adjacent to the last bit in the target string.

* * * * *